US012372417B2

(12) United States Patent
Gemma et al.

(10) Patent No.: US 12,372,417 B2
(45) Date of Patent: Jul. 29, 2025

(54) ADJUSTABLE TRANSITION EDGE THERMOMETER

(71) Applicant: INTERNATIONAL BUSINESS MACHINES CORPORATION, Armonk, NY (US)

(72) Inventors: Andrea Gemma, Zurich (CH); Bernd W. Gotsmann, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 17/856,026

(22) Filed: Jul. 1, 2022

(65) Prior Publication Data

US 2024/0003751 A1 Jan. 4, 2024

(51) Int. Cl.

| | |
|---|---|
| ***G01K 7/18*** | (2006.01) |
| ***G01K 7/42*** | (2006.01) |
| ***H10N 60/84*** | (2023.01) |

(52) U.S. Cl.

CPC ............... *G01K 7/425* (2013.01); *G01K 7/18* (2013.01); *H10N 60/84* (2023.02)

(58) Field of Classification Search

CPC .......... G01K 7/18; G01K 7/425; G01K 7/006; G01K 11/00; G01K 15/005; H10N 60/84; H01N 60/84

See application file for complete search history.

(56) References Cited

U.S. PATENT DOCUMENTS 4,869,598 A * 9/1989 McDonald ............ H10N 60/84 374/176
4,943,559 A * 7/1990 Severin .................. G01K 7/006 374/176
5,283,458 A * 2/1994 Stokes .................. H03H 9/172 257/419
5,450,053 A 9/1995 Wood
5,641,961 A * 6/1997 Irwin .................... G01T 1/1606 250/336.2
6,211,519 B1 * 4/2001 Nam ...................... G01K 7/006 374/E7.003
6,323,486 B1 11/2001 Grossman (Continued)

FOREIGN PATENT DOCUMENTS

CA 3044692 A1 * 6/2018 ............. G01K 11/00
DE 2251969 A1 * 4/1974 ......... G05D 23/2034

(Continued)

OTHER PUBLICATIONS

Computer translation of DE 198 17 786 downloaded from EPO website Feb. 21, 2025.*
Computer translation of DE 225969 A! downloaded from the EPO website on Feb. 25, 2025.*
“Bolometer”, From Wikipedia, the free encyclopedia, 2 pps., last edited on Jun. 12, 2022, <https://en.wikipedia.org/wiki/bolometer>.
“Superconductivity”, From Wikipedia, the free encyclopedia, 6 pps., last edited on May 28, 2022, <https://en.wikipedia.org/wiki/superconductivity>.

(Continued)

*Primary Examiner* — Randy W Gibson
(74) *Attorney, Agent, or Firm* — James L. Olsen

(57) ABSTRACT

Described are a temperature sensor, a semiconductor device, and a method of measuring a temperature of a sample. One embodiment of the temperature sensor may comprise a probe circuit, the probe circuit having a thermal operational range. The temperature sensor may further comprise a thermal resistor separating the probe circuit from a sample. The temperature sensor may further comprise a heating circuit adapted to maintain the probe circuit within the thermal operational range.

18 Claims, 8 Drawing Sheets

(56) References Cited

U.S. PATENT DOCUMENTS

| | | | | |
|---|---|---|---|---|
| 6,907,359 | B2 * | 6/2005 | Tanaka | G01K 7/006<br>374/176 |
| 6,974,952 | B2 * | 12/2005 | Morooka | G01J 1/06<br>374/176 |
| 7,009,694 | B2 | 3/2006 | Hart | |
| 7,462,921 | B2 * | 12/2008 | Kawahara | H01L 21/022<br>438/54 |
| 8,158,941 | B2 | 4/2012 | Gurvitch | |
| 9,726,547 | B2 | 8/2017 | Liu | |
| 10,431,408 | B2 | 10/2019 | Ma | |
| 10,794,775 | B2 * | 10/2020 | Umkehrer | G01K 15/005 |
| 2011/0248167 | A1 | 10/2011 | Gurvitch | |
| 2012/0223804 | A1 | 9/2012 | Gaitas | |
| 2016/0047699 | A1 * | 2/2016 | Seefeld | G01K 7/18<br>374/1 |
| 2018/0102232 | A1 | 4/2018 | Ma | |
| 2020/0141810 | A1 * | 5/2020 | Jain | H10N 70/231 |

FOREIGN PATENT DOCUMENTS

| | | | | |
|---|---|---|---|---|
| DE | 19817786 | A1 | 11/1999 | |
| EP | 2388564 | A1 | 11/2011 | |
| WO | 2009131674 | A2 | 10/2009 | |
| WO | WO-2019102071 | A1 * | 5/2019 | G01J 5/20 |

OTHER PUBLICATIONS

"Transition-edge sensor", From Wikipedia, the free encyclopedia, 2 pps., last edited on Oct. 23, 2020, <https://en.wikipedia.org/wiki/transition-edge_sensor>.

Cheng et al., "Precise nanoscale temperature mapping in operational microelectronic devices by use of a phase change material," Scientific reports, vol. 10, No. 1, 2020, 8 pp., <https://www.nature.com/articles/S41598-020-77021-1>.

Imada et al., "Metal-insulator transitions", Reviews of Modern Physics, vol. 70, No. 4, Oct. 1998, 225 pps., 0034-6861/98/70(4)/1039(225), © 1998 The American Physical Society.

Jerominek et al., "Micromachined, uncooled, VO2-based, IR Bolometer arrays", Downloaded from the internet on May 20, 2015, SPIE vol. 2746, 12 pps., <https://doi.org/10.1117/12.243056>.

International Search Report and Written Opinion, International Application No. IB2023/056756, Date of mailing: Sep. 22, 2023, 15 pages.

Kraus, H., "Superconductive bolometers and calorimeters", in final form Jun. 21, 1996, 16 pages.

* cited by examiner

ADJUSTABLE TRANSITION EDGE THERMOMETER

BACKGROUND

The present disclosure relates to thermometry, and more specifically, to thermometry systems and methods having wide range and high sensitivity.

Integrated, ultra-sensitive temperature sensors are used in many modern technologies, such as quantum sensors and devices (e.g., quantum cryptographic transmitters) working at cryogenic temperatures; neuromorphic hardware based on oscillatory neural networks; phase change or Resistive Random-Access Memory (RRAM) computer memory; conventional Complementary Metal-Oxide-semiconductor (CMOS) and III-V electronics (e.g., InP, InAs, GaAs, GaN, Al Sb, GaSb, and InSb); and the field of terahertz (THz) and/or infrared (IR) imaging, e.g., metrology, precision chemistry, and medical technology. Most such sensors measure a temperature-dependent electrical resistance. The detection sensitivity of the device may be given using a temperature coefficient (TCR).

SUMMARY

According to embodiments of the present disclosure, a temperature sensor, comprising a probe circuit, the probe circuit having a thermal operational range. The temperature sensor may further comprise a thermal resistor separating the probe circuit from a sample. The temperature sensor may further comprise a heating circuit adapted to maintain the probe circuit within the thermal operational range.

According to embodiments of the present disclosure, a semiconductor device, comprising a substrate and a contact thermometer attached to the substrate. The contact thermometer may comprise a probe circuit, the probe circuit having a thermal operational range. The contact thermometer may further comprise a thermal resistor separating the probe circuit from the substrate. The contact thermometer may further comprise a heating circuit adapted to maintain the probe circuit within the thermal operational range.

According to embodiments of the present disclosure, a method of measuring a temperature of a sample, comprising heating a sensor element to a temperature within the sensor's thermal operational range. The method may further comprise measuring an amount of power applied to maintain the sensor element at the temperature. The method may further comprise converting the measured amount of power to a sample temperature. The method may further comprise outputting the sample temperature.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
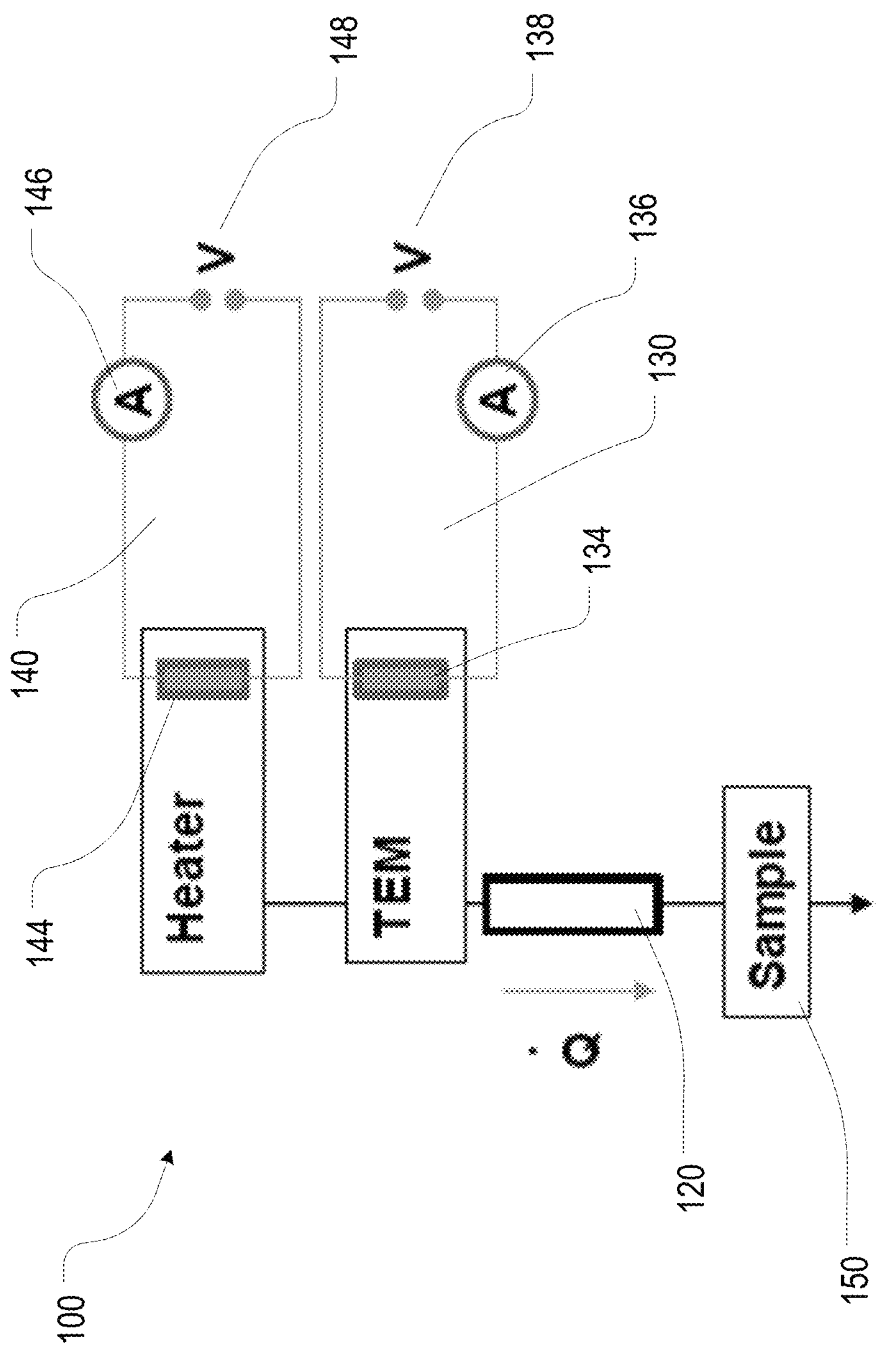
FIG. 1 is a schematic diagram of a first temperature sensor, consistent with some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to thermometry; more particular aspects relate to thermometry systems and methods having wide range and high sensitivity. While the present disclosure is not necessarily limited to such applications, various aspects of the disclosure may be appreciated through a discussion of various examples using this context.

A trade-off commonly exists between a sensor's sensitivity and the sensor's operational range. For example, the common PT100 (platinum 100) resistance thermometer can measure temperatures over a wide range (e.g., hundreds of degrees Kelvin (K)) but cannot accurately measure small changes in those temperatures (i.e., it has relatively poor sensitivity and/or a low TCR). Transition edge thermometers, on the other hand, can be extremely sensitive; some can measure the heat generated by a single photon. However, transition edge thermometers are conventionally restricted to a narrow operational range (e.g., typically below one degree K of operational range).

Accordingly, one aspect of the present disclosure is a contact temperature sensor, also referred to herein as a contact thermometer, that has both a wide operational range and a high detection sensitivity to changes in the temperature of a sample. Additionally, some embodiments may enable highly sensitive measurement of samples at relatively high temperatures (e.g., above room temperature). Another aspect of the present disclosure is a temperature sensor capable of self-calibration, i.e., a device that does not require a separate calibration operation before use. Another aspect of the disclosure is a method of measuring a temperature of a sample. In some embodiments, this method may include time resolved measurement to reduce thermal impact on the sample.

One feature and advantage of some embodiments is that they can be easily integrated into existing integrated circuits' (ICs) designs and manufacturing processes to provide an integrated thermometry solution, and in particular, may be integrated into many complementary metal-oxide-semiconductor (CMOS) semiconductor devices and associated manufacturing processes. This feature and advantage may be particularly desirable, for example, in neuromorphic and quantum devices, which typically specify a very low and well-defined temperature at which they will operate.

Another feature and advantage of some embodiments is that they may allow for measurement of radiation and/or conduction to and/or from the sample.

FIG. 1 is a schematic diagram of a first temperature sensor 100, consistent with some embodiments. Sensor 100 may comprise a thermal resistor 120 having a thermal resistance of Rth, a probing circuit 130, and a heating circuit 140. The probing circuit 130, in turn, may comprise a transition edge material (TEM), such as phase change material 134, electrically coupled to a circuit for measuring its electrical resistance, such as to a first current source 136 and a voltmeter 138. The heating circuit 140 may comprise a joule heat-emitting electrical resistor 144 electrically coupled to a second adjustable current source 146 and voltmeter 148 (or an adjustable voltage source with a current meter, not shown). That is, sensor 100 comprises the combination of a phase change material 134 providing a transition edge with an adjustable heat source (e.g., joule heat-emitting electrical resistor 144 of heating circuit 140) and a thermal resistor that links the phase change material 134 to the sample 150.

In operation, the phase change material 134 may provide a transition edge that can be detected using the adjustable current source 136 and the voltmeter 138. The heating circuit 140 may be controlled to maintain the temperature of the phase change material 134 within its operational range (i.e., at or near a critical temperature Tc). The thermal resistor 120 may allow a temperature difference to be maintained between the phase change material 134 and the sample 150 by the heating circuit 140. In this way, the phase change material 134 may be actively heated to and then held within its operational range when the sample 150 is below the critical temperature Tc by applying heating power "P" to the heating circuit 140. The amount of power "P" necessary to maintain that temperature may be measured via the voltage drop "V" across the electrical resistor 144 and the electrical current "I" through the electrical resistor 144, and then calculated by using Equation 1: P=V*I. The temperature of the sample 150, in turn, may be calculated from the calculated P using Equation 2:

$$T_{sensor}-T_{sample}=R^{th}*P \qquad \text{Equation 2:}$$

Using joule heating as described Equation 1, $T_{sensor}$ may be larger than $T_{sample}$. However, a person skilled in the art will see that a negative power P may be obtained using a Peltier effect in circuit 140. This latter embodiment is also within the scope of this disclosure.

The phase change material 134 may be any substance that undergoes a phase change under an external stimulus, such as heat. This phase change may be associated with a change in another physical or electrical property that can be measured to indicate the phase of the material. In the example given in FIG. 1, the state of the phase change material is measured through its electrical resistance. However, other kinds of measurement of the state of the phase change materials may be applied and are within the scope of this disclosure. For example, optical or mechanical properties of the phase change material may be probed. Phase change materials (PCM) come in many forms. For example, certain materials can be switched between two states of different electrical conductivity by changing their crystallographic state, which can be achieved by heating the phase change material. In particular, the phase change material 134 in sensor 100 may be a PCM material having a simple transition edge at temperature (Tc). One suitable such material is a micro-piece of metal superconductor (e.g., Niobium (Nb)) of approximately one micron in diameter. However, other superconducting and non-superconducting phase change materials and/or TEMs are also within the scope of this disclosure.

The thermal resistor 120 may be any material and/or physical configuration that enables the phase change material 134 to maintain a different temperature than the sample 150, while still maintaining a thermal relationship between the two (e.g., by allowing for predictable thermal flux). One suitable such thermal resistor 120 is an insert or beam of about 100 microns in length and a diameter of 100 nanometers (nm) made from a dielectric material, such as SiO2, silicon nitrides, or Al2O3. The exact thermal resistance (Rth) of the thermal resistor 120 may be determined via calibration in some embodiments, but may be on the order of Rth=10^6 to 10^8 K/W, depending on temperatures of the TEM and the sample 150. However, other thermal resistors 120 are within the scope of this disclosure and other values of Rth may be chosen according to application.

In some embodiments, the electrical resistor 144 may comprise any ordinary conductive material that will not undergo a transition during expected operation (e.g., an ordinary metal with a lower Tc than the phase change material 134, or an ordinary metal having no Tc). In other embodiments, the phase change material 134 itself may serve as the electrical resistor 144. In the later embodiments, a relatively higher voltage may be applied to the probe circuit 130 such that the phase change material 134 self-heats or partially self-heats. The later embodiments may be desirable in some applications for their simplicity and/or reliability.

Figure 2A:
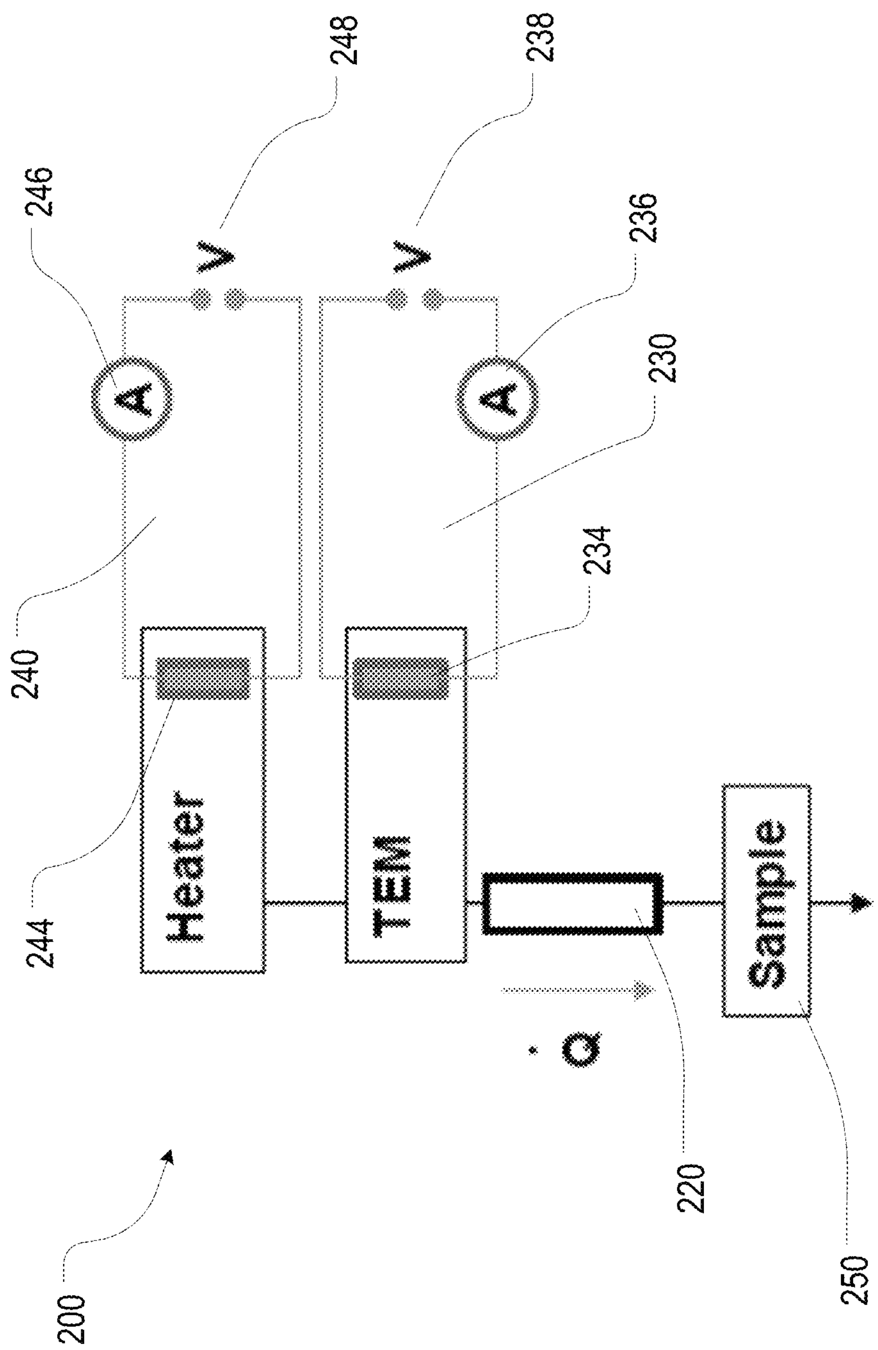
FIG. 2A is a schematic diagram of a second sensor, consistent with some embodiments.

FIG. 2A is a schematic diagram of a second sensor 200, consistent with some embodiments. Like sensor 100, sensor 200 may comprise a thermal resistor 220 having a thermal resistance value of Rth; a probing circuit 230 comprising a TEM, such as phase change material 234, an adjustable current source 236, and a first voltmeter 238; a heating circuit 240 comprising a joule heat emitting electrical resistor 244 electrically coupled to a second adjustable current source 246 and a second voltmeter 248.

In sensor 200, the phase change material 234 may exhibit hysteresis. That is, transition temperature of the phase change material 234 may depend on a direction of a temperature ramp, with an upper transition temperature at Tc1 and a lower transition temperature at Tc2. Examples of phase change materials 234 that exhibit hysteresis effects include, without limitation, vanadium dioxide (VO2). Embodiments using VO2 may be desirable because VO2 can be integrated with conventional CMOS integrated circuit designs and has high transition temperatures. Other suitable metallic and superconducting materials that exhibit hysteric effects may be found at: Reviews of Modern Physics, Vol. 70, No. 4, October 1998 0034-6861/98/70(4)/1039(225), the operational temperatures of which may range from tens of degrees K to hundreds of degrees K. Using this sensor 200 embodiment, any sample temperature lower than Tc1 can be measured.

Figures 2B, 2C, 2D:
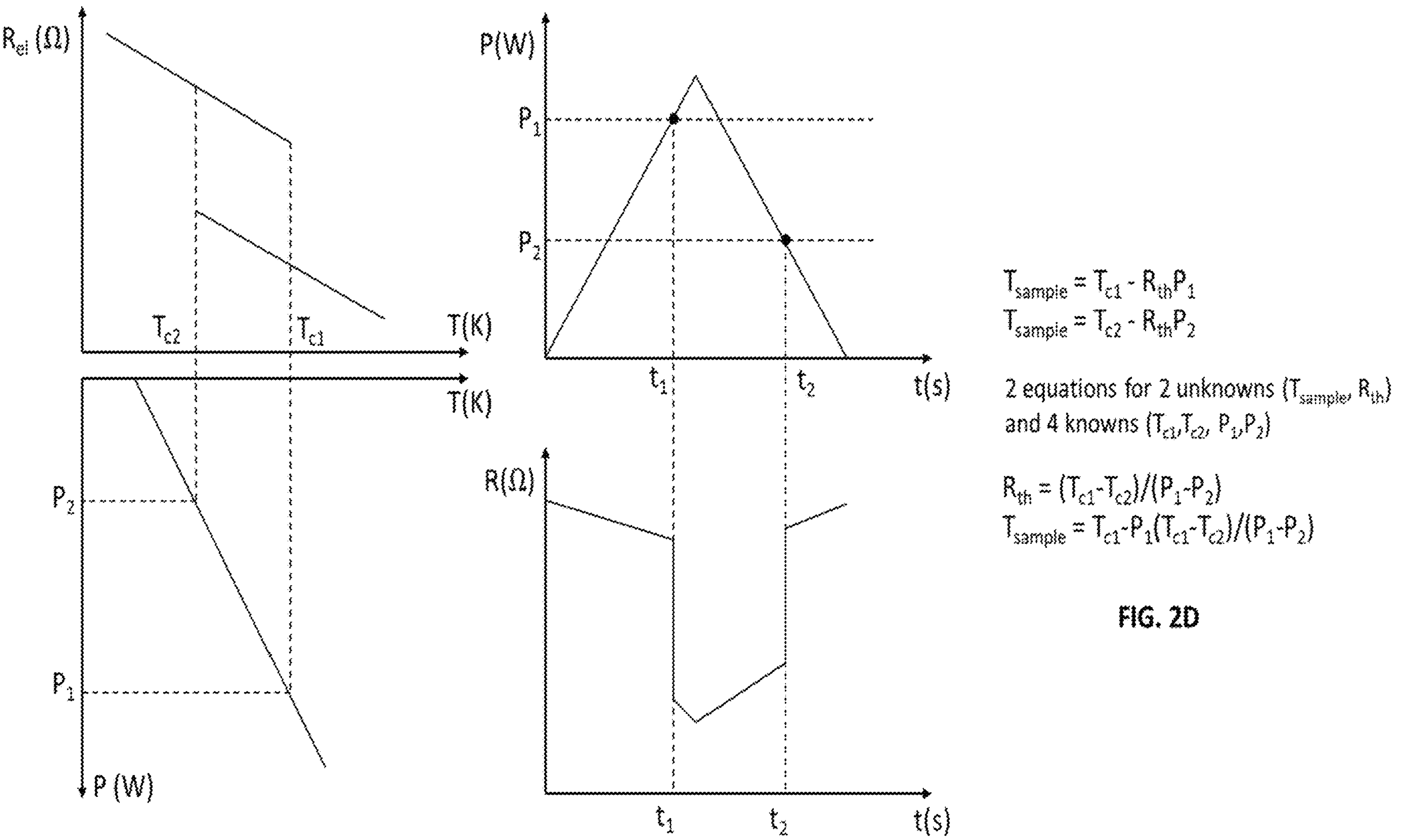
FIGS. 2B, 2C, and 2D are an illustrative example of the second sensor in operation.

In operation, the power P supplied to the heating circuit 240 may be increased and decreased (i.e., supplied P in sensor 200 is a function of time) such that the transition points Tc1 and Tc2 are alternatively triggered, and independent measurements of power P may be made at each transition point. Equation 1 may then be simultaneously solved for both resulting power P measurements. This, in turn, may allow both the temperature of the sample 150 and the exact value of Rth to be calculated. That is, one feature and advantage of sensor 200 is that it is capable of self-calibration. FIGS. 2B, 2C, and 2D are an illustrative example of the second sensor 200 in operation. In particular, FIGS. 2B and 2C shows the resistance and P(t) curves for the illustrative example, and FIG. 2D shows two equations (e.g., equations 3-4) with two unknowns (i.e., Rth and $T_{sample}$) that may be used for self-calibration:

$$T_{sample}=T_{c1}-R_{th}P_1 \quad \text{Equation 3:}$$

$$T_{sample}=T_{c2}-R_{th}P_2 \quad \text{Equation 4:}$$

$$T_{sample}=(T_{c1}-T_{c2})/(P_1-P_2) \quad \text{Equation 3:}$$

$$T_{sample}=T_{c1}-P_1(T_{c1}-T_{c2})/(P_1-P_2) \quad \text{Equation 3:}$$

Figure 3:
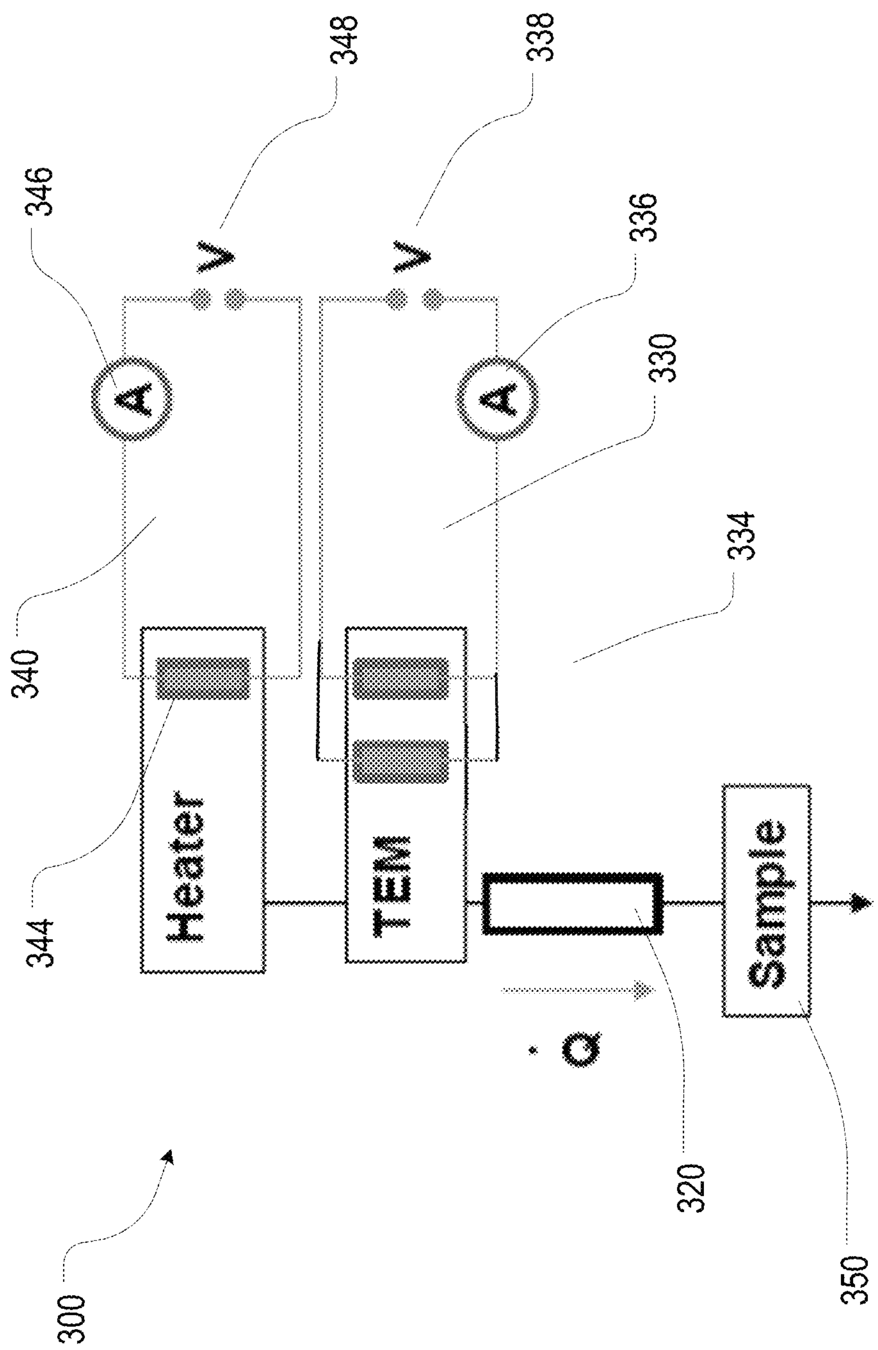
FIG. 3 is a schematic diagram of a third sensor, consistent with some embodiments.

FIG. 3 is a schematic diagram of a third sensor 300, consistent with some embodiments. Like sensor 200, sensor 300 may comprise a thermal resistor 320 having a temperature resistance value of Rth; a probing circuit 330 comprising one or more current source 336 and a voltmeter 338; a heating circuit 340 comprising a joule heat emitting electrical resistor 344 electrically coupled to a second adjustable current source 346 and a second voltmeter 348. Additionally, sensor 300 may comprise two TEMs, such as two-phase change materials 334*a* and 334*b* having different critical temperatures. The phase change materials 334*a* and 334*b* may each be the single transition edge type discussed with reference to FIG. 1 or the hysteresis type discussed with reference to FIG. 2. As depicted in FIG. 3, the phase change materials 334*a*, 334*b* may be separated from the sample 150 by the same (i.e., a single) thermal resistor 320. However, embodiments in which the phase change materials 334*a*, 334*b* also have their own, independent thermal resistors 320 are also within the scope of this disclosure. In FIG. 3, the two TEM may be integrated into the probing circuit as parallel resistors. Depending on specific TEMs chosen, a serial resistor arrangement, or separating the probing circuit 330 into two circuits, one for each TEM, may be advantageous. These latter embodiments are also included in the present disclosure.

Advantageously, the different phase change materials 334*a* and 334*b* in sensor 300 may be selected such that they have significantly different critical temperatures (e.g., for hysteresis type, the Tc1 and Tc2 for material 334*a* are both less than Tc1 and Tc2 for material 334*b*). In this way, a relatively larger temperature range may be accessible at high accuracy to sensor 300. Additionally, the sensor 300 embodiment may be desirable in applications where self-calibration is desired for single transition edge TEM because the two independent measurements of P can be collected from the two transition edge materials 334*a* and 334*b*. Then, as explained with reference to sensor 200, Equation 2 can be solved simultaneously to calculate both sample temperature and Rth.

Figure 4:
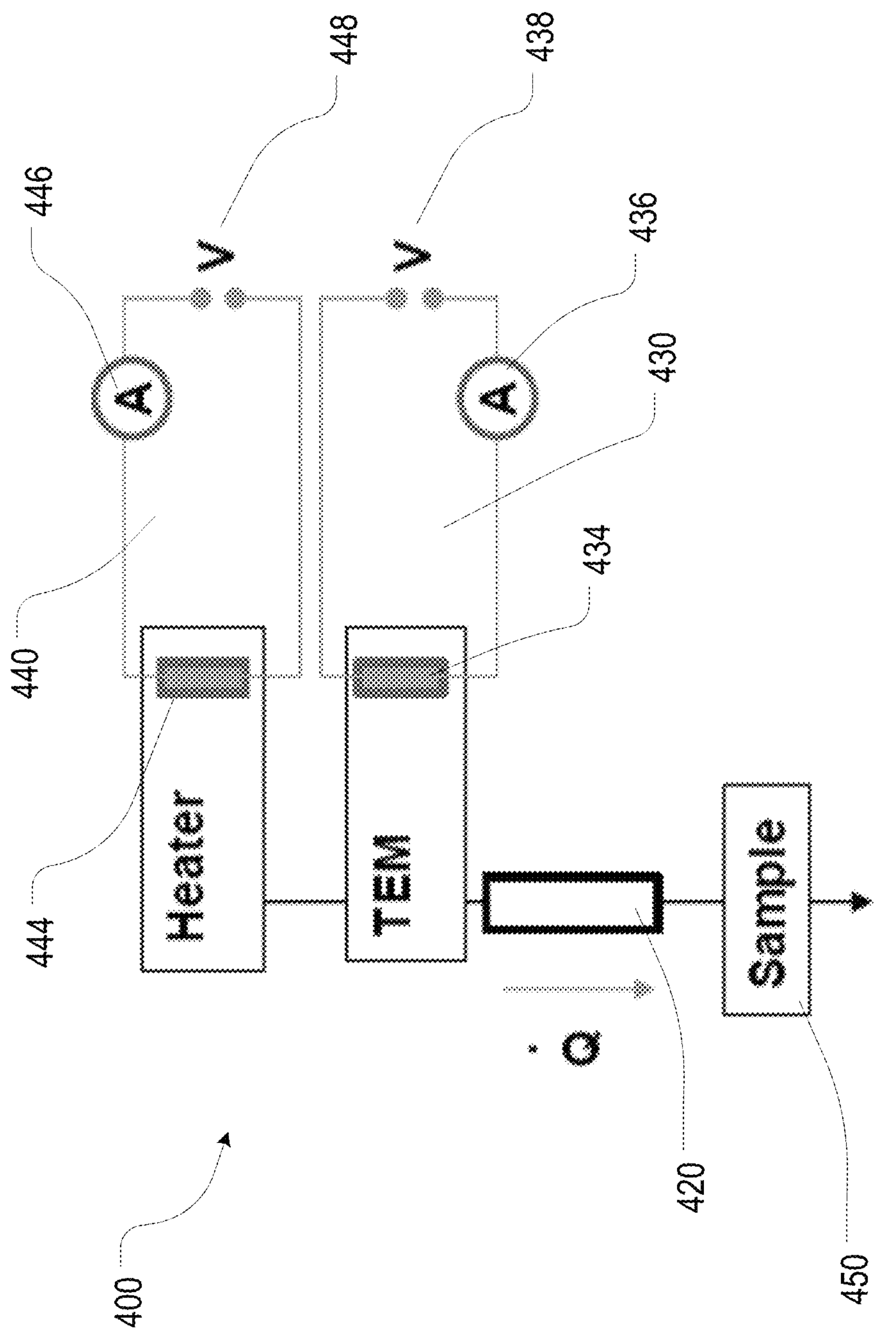
FIG. 4 is a schematic diagram of a fourth sensor, consistent with some embodiments.

FIG. 4 is a schematic diagram of a fourth sensor 400, consistent with some embodiments. Like sensor 200, sensor 400 may comprise a thermal resistor 420 having a temperature resistance value of Rth; a probing circuit 430 comprising a TEM, such a phase change material 434, first adjustable current source 436, and a voltmeter 438; a heating circuit 440 comprising a joule heat emitting electrical resistor 444 electrically coupled to a second adjustable current source 446 and a second voltmeter 448. In operation, because the heat P produced during the measurement process could significantly change the temperature of the sample 150 in some applications (e.g., depending on the coupling to the thermal environment and its heat capacity), this fourth sensor 400 may power its heating circuit 440 dynamically/intermittently. That is, for each temperature measurement T by sensor 400, the power P applied to the heating circuit 440 may ramp from zero (0) to P1 (i.e., the measured power at when the phase change material 434 is at Tc1), and then immediately ramp back down to zero power. Some embodiments may also measure P2 (i.e., the measured power when the phase change material 434 is at TC1) as described with reference to FIG. 2. In still other embodiments, sensor 400 may measure the time (t1) to reach the critical temperature Tc1 at a known heating rate (p) and then infer the power P measurement using Equation 7.

$$P(tx)=p\times tx. \quad \text{Equation 7:}$$

In this way, for a known p, the measurement of voltage can be replaced by a measurement of time, Tx, to reach TC1.

Figure 5:
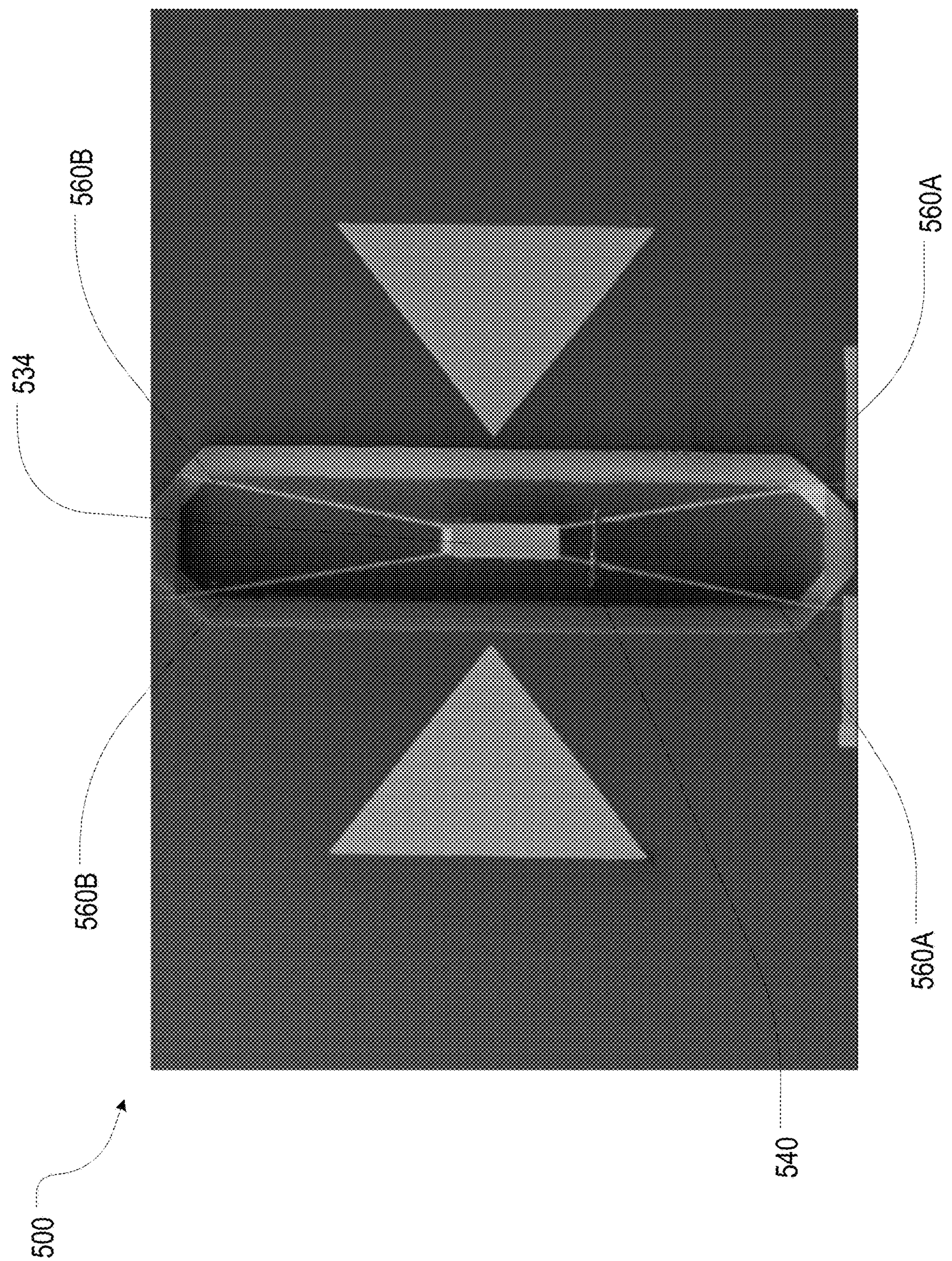
FIG. 5 is a scanning electron micrograph of a first sample temperature sensor, consistent with some embodiments.

FIG. 5 is a scanning electron micrograph of a first sample temperature sensor 500, consistent with some embodiments. This first sample sensor 500 is a MEMS-based device (MEMS stands for microelectromechanical system) comprising a heater 534, a phase change material 540, and electrical conductors 560*a* and 560*b*. This sensor can measure the temperature of a chip, or other sample of interest. In this sensor 500, the thermal resistive element (described above) may comprise the two electrical conductors 560*b*. Because these conductors 560*a* and 560*b* have a length substantially greater than their diameter, their physical configuration limits the rate of heat conduction along the length dimension, creating an effective thermal resistance (Rth) on the order of 10^7 K/W. The heater 540 in sensor 500 may comprise a platinum thin film resistor 534 electrically connected by the conductors 560B. The phase change material 530 in sensor 500 may be VO2.

Figure 6:
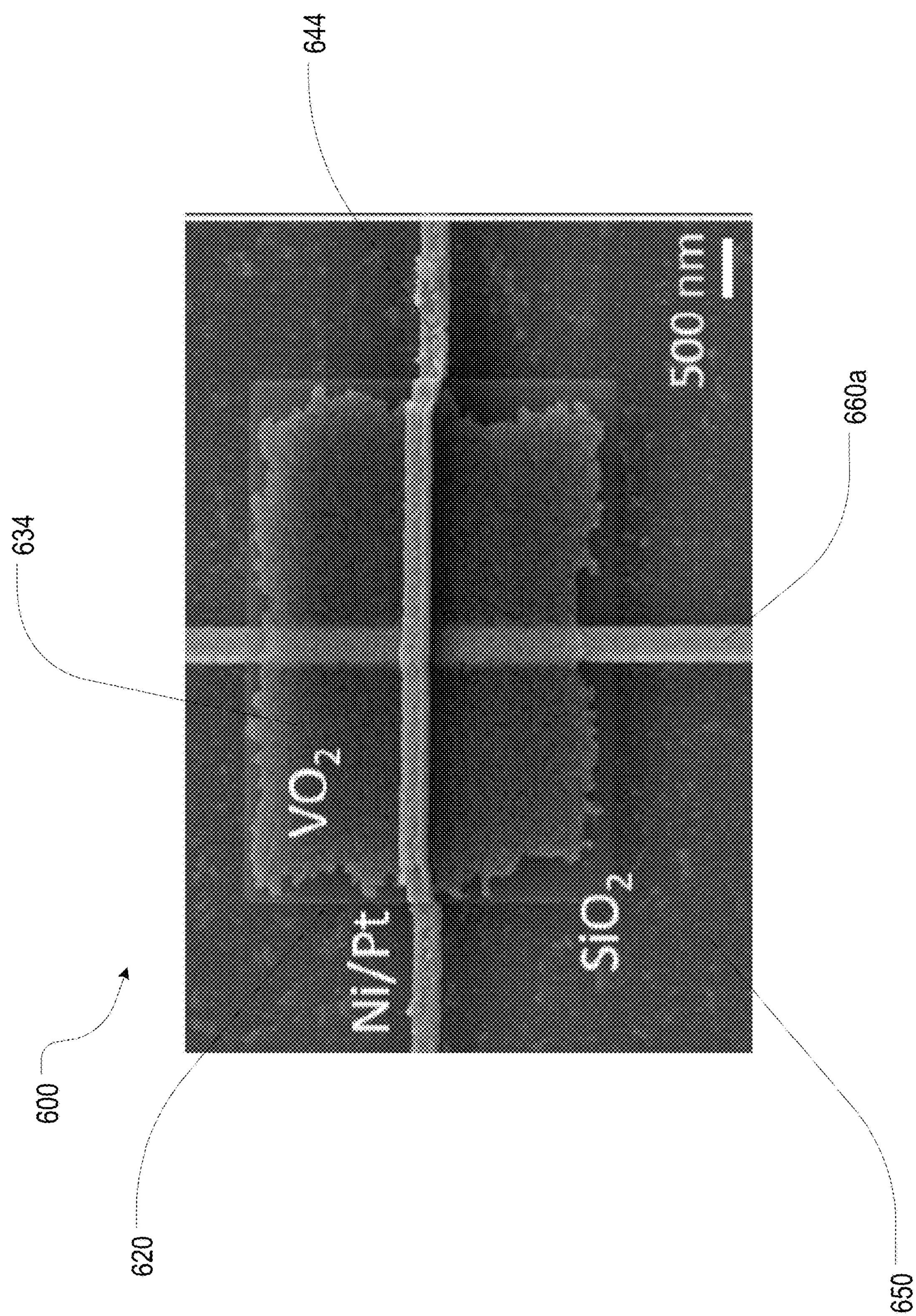
FIG. 6 is a scanning electron micrograph of a second sample temperature sensor, consistent with some embodiments.

FIG. 6 is a scanning electron micrograph of a second sample temperature sensor 600, consistent with some embodiments. This second sample sensor 600 is an integrated CMOS semiconductor device comprising a plurality of stacked layers on a substrate 650. These layers may be in proximately connected to each other. The term "proximately connected" may be used herein to describe a connection between two components, specifically components that are directly connected to or touching each other, and/or, for example, components that would be directly connected but for the oxide layer between them. Starting at substrate 650 and proceeding distally, these layers may comprise a thermal resistor layer 620, first conductor 660*a*, phase change material 634, and a second conductor 644. For this CMOS-based embodiment, example choices of materials include VO2 for the phase change material 634, SiO2 for the thermal resistor layer 620, and an Ni/Pt alloy for the electrical conductors 644 and 660*a*. Embodiments using VO2 for the phase change material 634 may be desirable because VO2 be integrated into CMOS integrated circuit designs.

Sensor 600 may be desirable for use in common CMOS applications because it is comparatively simpler than sensor 500 and because it may better resist damage from G-forces. Additionally, sensor 600 may be desirable for on-chip thermometry because back end of line (BEOL) dielectrics or silicon oxide layers are relatively good thermally insulating materials, such that a thermal resistance on the order of >10^6 K/W can be reached using sub-micron sensors and because of the power dissipated by the sensor 600 is typically of less concern in such applications. Sensor 600 may also be desirable for VO2-based oscillating neural networks, as these chip designs specify a well-controlled chip temperature.

Figure 7:
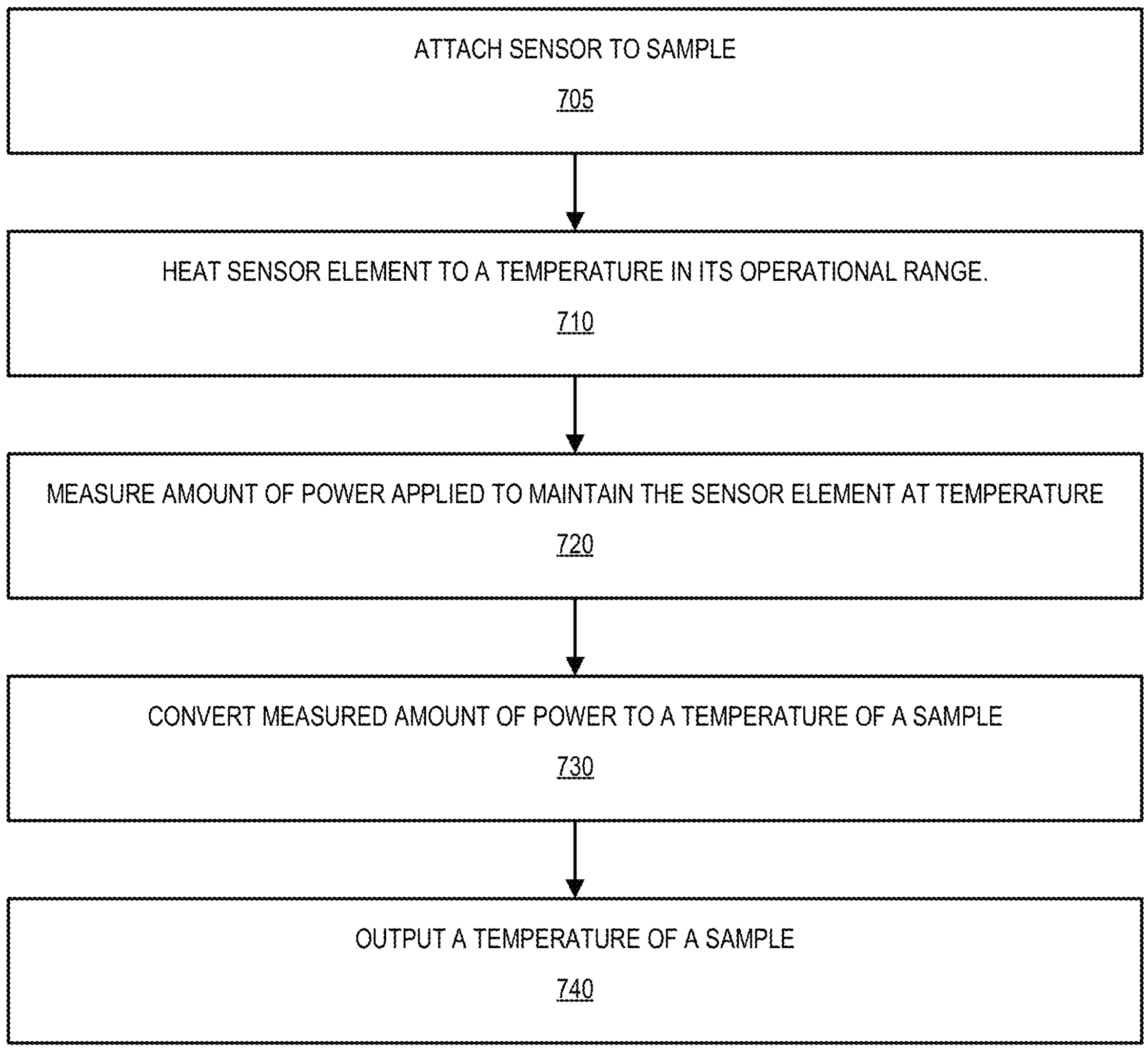
FIG. 7 is a flow chart illustrating one method for measuring a method of measuring a temperature of a sample, consistent with some embodiments.

FIG. 7 is a flow chart illustrating one method 700 for measuring a temperature of a sample, consistent with some embodiments. In particular, method 700 may be used with one or more of the sensors described with reference to FIGS. 1-6. At operation 705, a sensor may be physically attached to a sample. The sensor may comprise a sensor element, the sensor element having an operational range, a thermal resistor separating the sensor element from a sample, and a heating circuit adapted to maintain the sensor element within the operational range. The sensor element may comprise a phase change material. At operation 710, a sensor element may be heated to a temperature in its operational range. In some embodiments, heating the sensor element to its operational range may comprise applying the amount of power to a heating circuit; in other embodiments, it may comprise applying the amount of power to a sensor element. In some embodiments, a hysteresis of a transition in the phase change material may be periodically induced via temporal variation of the amount of power applied to the sensor element.

Next, an amount of power applied to maintain the sensor element at a temperature may be measured at operation 720. In some embodiments, this may comprise measuring a first amount of power applied to the sensor element at a first critical temperature of the phase change material, measuring a second amount of power applied to the sensor element at a second critical temperature of the phase change material, and calibrating the sensor element and the thermal resistor using the measured first and second amounts of power. The measured amount of power may be converted to a temperature of a sample at operation 730, and the converted temperature may be output at operation 740. At operation 750, the amount of power applied to heat the sensor element may be removed to allow the sample to cool. Operations 710-750 may be repeated to dynamically apply and reduce the amount of dissipated power.

General

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

Therefore, it is desired that the embodiments described herein be considered in all respects as illustrative, not restrictive, and that reference be made to the appended claims for determining the scope of the invention.

What is claimed is:

1. A temperature sensor, comprising:
- a probe circuit, the probe circuit having a thermal operational range;
- a thermal resistor separating the probe circuit from a sample; and
- a heating circuit adapted to maintain the probe circuit within the thermal operational range.

2. The temperature sensor of claim 1, wherein the heating circuit comprises a joule emitting resistor electrically coupled to a second current source and a second voltmeter.

3. The temperature sensor of claim 1, wherein the probe circuit comprises a transition edge sensor element electrically coupled to a first current source and a first voltmeter.

4. The temperature sensor of claim 3, wherein the heating circuit and the thermal resistor are proximally connected to the transition edge sensor element.

5. The temperature sensor of claim 3, wherein the transition edge sensor element comprises a first phase change material.

6. The temperature sensor of claim 5, wherein the first phase change material comprises vanadium dioxide ($VO_2$).

7. The temperature sensor of claim 5, wherein the first phase change material comprises a first critical temperature when heated and a second critical temperature when cooled.

8. The temperature sensor of claim 7, wherein the temperature sensor is self-calibrating.

9. The temperature sensor of claim 5, wherein the transition edge sensor element further comprises a second phase change material, wherein a critical temperature of the first phase change material is higher than a critical temperature of the second phase change material.

10. The temperature sensor of claim 5, wherein the heating circuit comprises the first phase change material electrically coupled to the first current source and the first voltmeter.

11. The temperature sensor of claim 3, wherein the thermal resistor comprises a metallic beam, wherein the metallic beam is adapted to conduct current to the transition edge sensor element.

12. A semiconductor device, comprising:
- a substrate; and
- a contact thermometer attached to the substrate, the contact thermometer comprising:
  - a probe circuit, the probe circuit having a thermal operational range;
  - a thermal resistor separating the probe circuit from the substrate; and
  - a heating circuit adapted to maintain the probe circuit within the thermal operational range.

13. A method of measuring a temperature of a sample, comprising:
- heating a sensor element comprising a phase change material to a temperature within a thermal operational range of the sensor element, wherein the sensor element is separated from the sample with a thermal resistor;
- measuring an amount of power applied to maintain the sensor element at the temperature;
- converting the measured amount of power to a sample temperature; and
- outputting the sample temperature.

14. The method of claim 13, wherein a hysteresis of a transition in the phase change material is periodically induced via temporal variation of the amount of power applied to the sensor element.

15. The method of claim 14, further comprising:
- measuring a first amount of power applied to the sensor element at a first critical temperature of the phase change material;
- measuring a second amount of power applied to the sensor element at a second critical temperature of the phase change material; and
- calibrating the sensor element and the thermal resistor using the measured first and second amounts of power.

16. The method of claim 13, wherein heating the sensor element to the temperature within the thermal operational range comprises applying the amount of power to a heating circuit.

17. The method of claim 13, wherein heating the sensor element comprises applying the amount of power to the sensor element.

18. The method of claim 13, wherein the amount of power applied to heat the sensor element is repeatedly applied and removed.

* * * * *